United States Patent
Utsumi et al.

(10) Patent No.: US 9,953,993 B2
(45) Date of Patent: Apr. 24, 2018

(54) SEMICONDUCTOR MEMORY DEVICE

(71) Applicant: Toshiba Memory Corporation, Minato-ku (JP)

(72) Inventors: Tetsuaki Utsumi, Yokohama (JP); Katsuaki Isobe, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/457,316

(22) Filed: Mar. 13, 2017

(65) Prior Publication Data
US 2018/0026044 A1 Jan. 25, 2018

Related U.S. Application Data

(60) Provisional application No. 62/366,417, filed on Jul. 25, 2016.

(51) Int. Cl.

| | |
|---|---|
| *H01L 27/11556* | (2017.01) |
| *H01L 27/11519* | (2017.01) |
| *H01L 27/11565* | (2017.01) |
| *H01L 27/11524* | (2017.01) |
| *H01L 27/11582* | (2017.01) |
| *H01L 27/1157* | (2017.01) |
| *H01L 27/11526* | (2017.01) |
| *H01L 27/11573* | (2017.01) |

(52) U.S. Cl.
CPC .... *H01L 27/11556* (2013.01); *H01L 27/1157* (2013.01); *H01L 27/11519* (2013.01); *H01L 27/11524* (2013.01); *H01L 27/11565* (2013.01); *H01L 27/11582* (2013.01); *H01L 27/11526* (2013.01); *H01L 27/11573* (2013.01)

(58) Field of Classification Search
CPC ......... H01L 27/11524; H01L 27/11556; H01L 27/1157; H01L 27/11519; H01L 27/11565; H01L 27/11582
See application file for complete search history.

(56) References Cited

U.S. PATENT DOCUMENTS

| | | | | |
|---|---|---|---|---|
| 6,044,016 | A * | 3/2000 | Itoh | H01L 27/115 257/316 |
| 6,272,046 | B1 * | 8/2001 | Shimada | G11C 16/26 365/185.17 |
| 8,102,711 | B2 * | 1/2012 | Maejima | G11C 5/02 365/185.05 |

(Continued)

FOREIGN PATENT DOCUMENTS

JP 2010-98235 4/2010

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

A semiconductor memory device includes a plurality of word lines stacked in a first direction; a semiconductor pillar extending through the plurality of word lines in the first direction; a source line electrically connected to the semiconductor pillar; and a transistor arranged in the first direction with the plurality of word lines. The transistor includes a gate electrode, source and drain regions positioned on both sides of the gate electrode respectively. The source line is positioned between the transistor and the plurality of word lines, and is electrically connected to one of the source and drain regions.

20 Claims, 7 Drawing Sheets

(56) References Cited

U.S. PATENT DOCUMENTS

| | | | |
|---|---|---|---|
| 8,461,627 B2* | 6/2013 | Byeon | H01L 27/105 257/208 |
| 9,356,034 B1* | 5/2016 | Yada | H01L 27/11575 |
| 9,589,978 B1* | 3/2017 | Yip | H01L 27/11573 |
| 9,627,403 B2* | 4/2017 | Liu | H01L 27/11582 |
| 2009/0090960 A1* | 4/2009 | Izumi | H01L 27/115 257/324 |
| 2010/0096682 A1 | 4/2010 | Fukuzumi et al. | |
| 2010/0207195 A1* | 8/2010 | Fukuzumi | G11C 16/0483 257/326 |
| 2011/0001178 A1* | 1/2011 | Iwase | H01L 21/28282 257/315 |
| 2011/0284946 A1* | 11/2011 | Kiyotoshi | H01L 27/11565 257/324 |
| 2011/0291174 A1* | 12/2011 | Ooike | H01L 21/76224 257/316 |
| 2013/0130468 A1 | 5/2013 | Higashitani et al. | |
| 2013/0130495 A1* | 5/2013 | Higashitani | H01L 27/11565 438/630 |
| 2013/0322178 A1* | 12/2013 | He | G11C 16/08 365/185.17 |
| 2014/0192598 A1* | 7/2014 | He | G11C 16/0483 365/185.17 |
| 2014/0241026 A1* | 8/2014 | Tanzawa | G11C 5/063 365/72 |
| 2015/0001613 A1* | 1/2015 | Yip | H01L 27/115 257/329 |
| 2015/0179660 A1* | 6/2015 | Yada | H01L 21/02164 257/321 |
| 2015/0255478 A1* | 9/2015 | Tanzawa | H01L 27/11556 257/314 |
| 2016/0056169 A1 | 2/2016 | Lee et al. | |
| 2016/0163730 A1* | 6/2016 | Lim | H01L 27/11582 257/314 |
| 2017/0047343 A1* | 2/2017 | Lee | H01L 27/11582 |
| 2017/0117182 A1* | 4/2017 | Lee | H01L 21/76897 |
| 2017/0179151 A1* | 6/2017 | Kai | H01L 27/11582 |

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/366,417 filed on Jul. 25, 2016; the entire contents of which are incorporated herein by reference.

FIELD

Embodiments are generally related to a semiconductor memory device.

BACKGROUND

A semiconductor memory device is under developing, which includes three-dimensionally disposed memory cells. For example, a NAND-type memory device includes a plurality of word lines stacked on a source line and a semiconductor pillar extending therethrough in the stacking direction. The memory cells are provided at portions respectively where the semiconductor pillar extends through the word lines. The semiconductor pillar is electrically connected to the source line, and acts as a channel body of each memory cells. The word lines act as control gates of the memory cells. Thus, the memory cells are operated respectively by a voltage between each of the word lines and the source line. In the device having such a structure, there may be a case where a voltage variation is increased due to a parasitic resistance of the source line, and results in a factor which induces a malfunction in the memory cells.

DETAILED DESCRIPTION

According to one embodiment, a semiconductor memory device includes a plurality of word lines stacked in a first direction; a semiconductor pillar extending through the plurality of word lines in the first direction; a source line electrically connected to the semiconductor pillar; and a transistor arranged in the first direction with the plurality of word lines. The transistor includes a gate electrode, source and drain regions positioned on both sides of the gate electrode respectively. The source line is positioned between the transistor and the plurality of word lines, and is electrically connected to one of the source and drain regions.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1A:
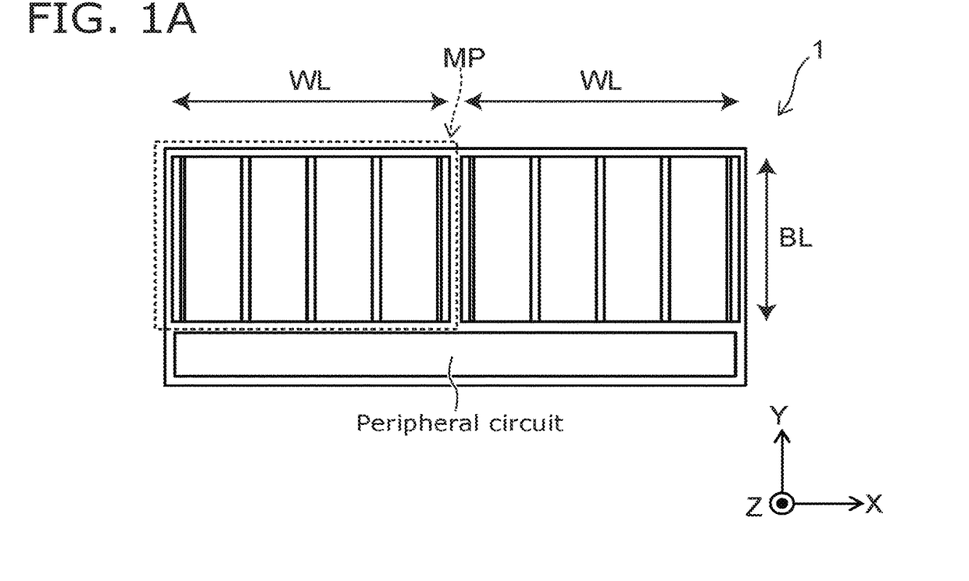
FIGS. 1A and 1B are schematic plan views showing a configuration of a semiconductor memory device according to an embodiment.
Figure 1B:
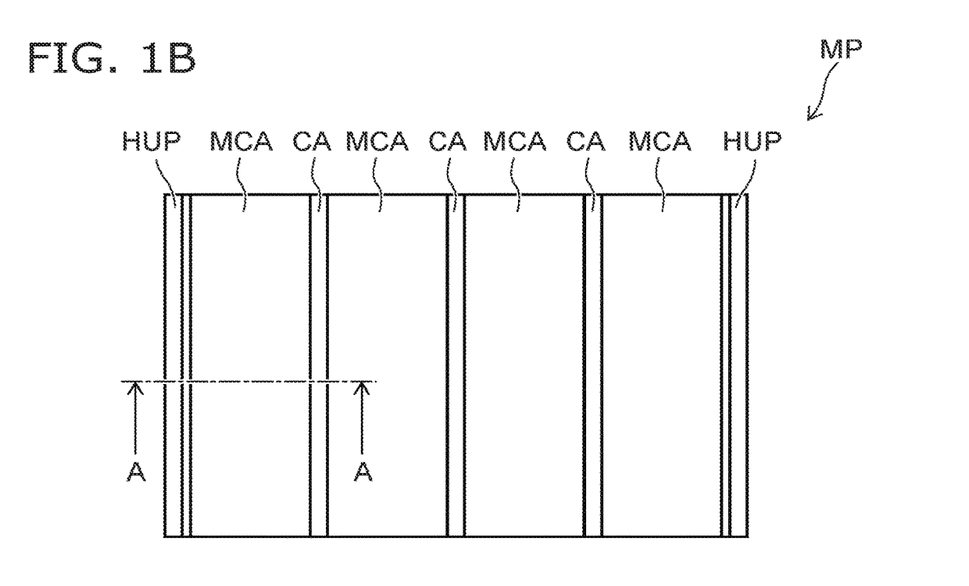

FIGS. 1A and 1B are schematic plan views showing a configuration of a semiconductor memory device 1 according to an embodiment. FIG. 1A is a plan view showing an arrangement of the chip surfaces of the semiconductor memory device 1. FIG. 1B is a plan view showing a memory plane MP shown in FIG. 1A.

As shown in FIG. 1A, the memory plane MP and a peripheral circuit region are provided on a chip surface of the semiconductor memory device 1. In the memory plane MP, a word line WL extends in the X direction, and a bit line BL extends in the Y direction.

As shown in FIG. 1B, the memory plane MP includes memory cell arrays MCA, hook-up areas HUP, and contact areas CA. The hook-up areas HUP are positioned respectively at both ends of the word line WL extending in the X direction. The contact regions CA are arranged along the word line WL extending in the X direction.

Figure 2:
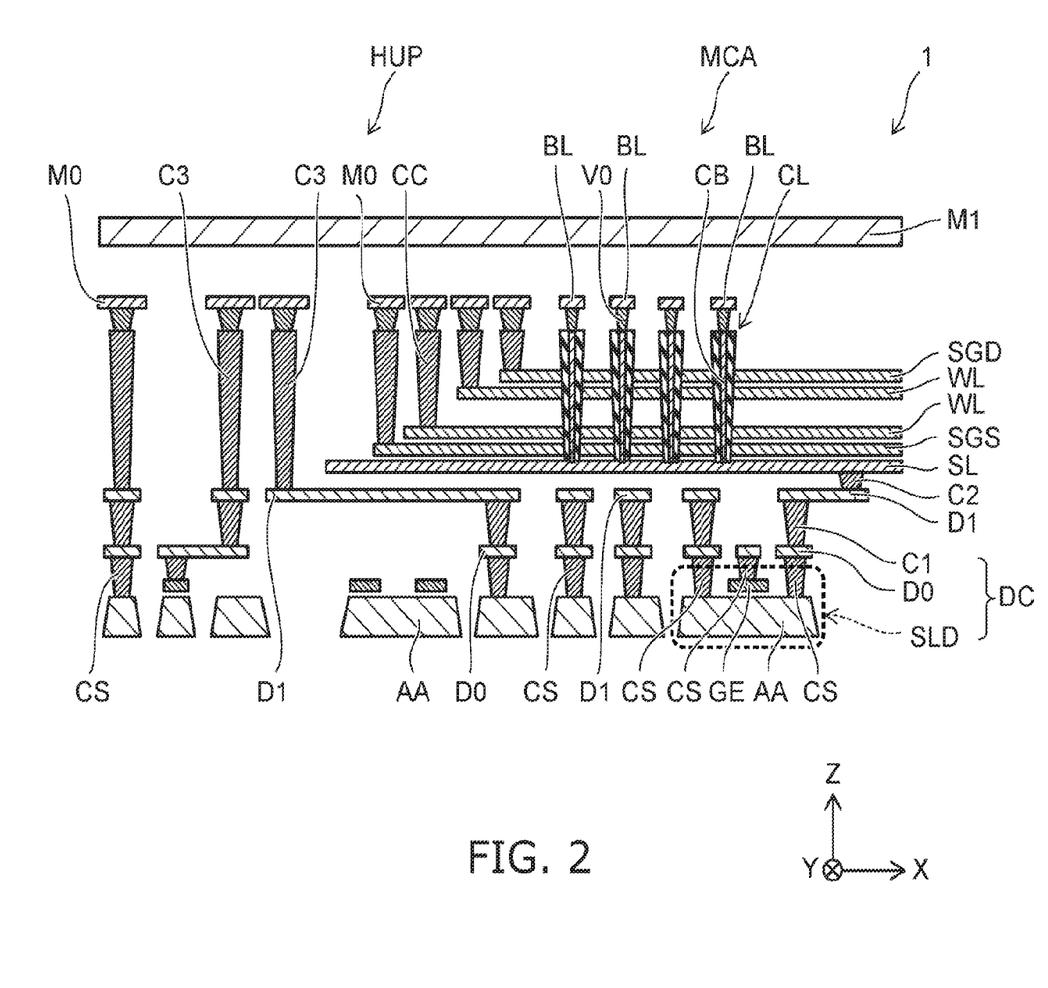
FIG. 2 is a schematic cross-sectional view showing the semiconductor memory device according to the embodiment.

FIG. 2 is a schematic cross-sectional view showing the semiconductor memory device 1 according to the embodiment. FIG. 2 is a schematic view showing a cross section taken along the line A-A shown in FIG. 1. In FIG. 2 and the subsequent drawings, interlayer insulating films for electrically insulating each component are omitted for convenience.

As shown in FIG. 2, the semiconductor memory device 1 includes, for example, a driving circuit DC provided on a surface of a silicon substrate (not shown), a memory cell array MCA, a source line SL, and bit lines BL. The source line SL is a plate-shaped conductor extending in the X direction and the Y direction, and includes, for example, a polycrystalline silicon layer or a metal layer, or both. The bit lines BL are, for example, metal interconnect wires.

The memory cell array MCA includes a selection gate SGS, a plurality of word lines WL and a selection gate SGD. The selection gate SGS, the word lines WL and the selection gate SGD are, for example, metal layers, which are sequentially stacked in the Z direction on the source line SL. Moreover, the memory cell array MCA is positioned between the source line SL and the bit lines BL. The source line SL is provided between the memory cell array MCA and the driving circuit DC. It should be noted that word lines WL positioned between two word lines WL illustrated in FIG. 2 are omitted for convenience in describing the semiconductor memory device 1. Also in drawings described later, the word lines WL are illustrated in the same manner.

The memory cell array MCA further includes a plurality of columnar bodies CL. The columnar bodies CL extend through the selection gate SGS, the plurality of word lines WL, and the selection gate SGD in the Z direction, respectively. The columnar bodies CL each include a channel body CB extending in the Z direction. The channel body CB is a semiconductor pillar, such as polycrystalline silicon layer or the like. The channel body CB is electrically connected to the source line SL at a bottom end thereof. In addition, the top end of the channel body CB is electrically connected to one of the bit lines BL via contact plugs V0 and V1.

The memory cell array MCA includes memory cells provided at portions where each columnar body CL extends through the word lines WL. Moreover, the memory cell array MCA includes a source side selection transistor at a portion where the columnar body CL extends through the selection gate SGS, and a drain side selection transistor at a portion where the columnar body extends through the selection gate SGD.

The end portions of the source line SL, the word lines WL, and the select gates SGS, SGD are positioned in the hook-up area HUP and are formed into stairs. The end portions of the word lines WL, the select gates SGS and SGD are electrically connected to the upper interconnect wires M0 respectively, for example, via the contact plugs CC. The contact plugs CC extend in the Z direction, and are electrically connected to the ends of the word lines WL and the select gates SGS and SGD respectively at the bottom ends thereof.

The semiconductor memory device 1 includes a plurality of interconnect layers positioned at different levels respectively. Here, an "interconnect wire M0" is one of interconnect wires included in the interconnect layer M0. The interconnect layer M0 includes, for example, a plurality of bit lines BL. Hereinafter, other interconnect layers are expressed in the same manner.

The driving circuit DC includes, for example, a plurality of MOS transistors, one of which is a transistor SLD that drives the source line SL. The transistor SLD includes an active region AA and a gate electrode GE disposed thereon. The active region AA includes source/drain regions located on both sides of the gate electrode GE. The active region AA is provided, for example, in a P-type well provided in a silicon substrate.

The semiconductor memory device 1 includes, for example, two interconnect layers D0 and D1 between the driving circuit DC and the source line SL. The gate electrode GE of the transistor SLD is electrically connected to the interconnect wire D0 through a contact plug CS. A part of the active region AA corresponding to one of the source/drain regions of the transistor SLD is electrically connected to other interconnect wire D0, for example, via a contact plug CS, and further electrically connected to an interconnect wire D1 via a contact plug C1. The interconnect wire D1 is electrically connected to the source line SL via a contact plug C2.

That is, the transistor SLD is electrically connected to the source line SL via the interconnect layers D0 and D1 between the driving circuit DC and the source line SL. Then, the transistor SLD controls the potential supplied to the source line SL. For example, by disposing at least one transistor SLD under the source line SL, it is possible to suppress voltage drop in the source line SL, and thereby, to achieve a uniform distribution of electrical potential therein.

The transistor SLD may be positioned under the memory cell array MCA or one of the contact regions CA.

Moreover, in the hook-up area HUP, the driving circuit DC is electrically connected to an interconnect wire M0 via a contact plug C3. The contact plug C3 extends in the Z direction, and is electrically connected to other interconnect wire D1 at a bottom end thereof. That is, the driving circuit DC is electrically connected to the driving circuit DC via an interconnect wire D0, an interconnect wire D1 and the contact plug C3.

Figure 3:
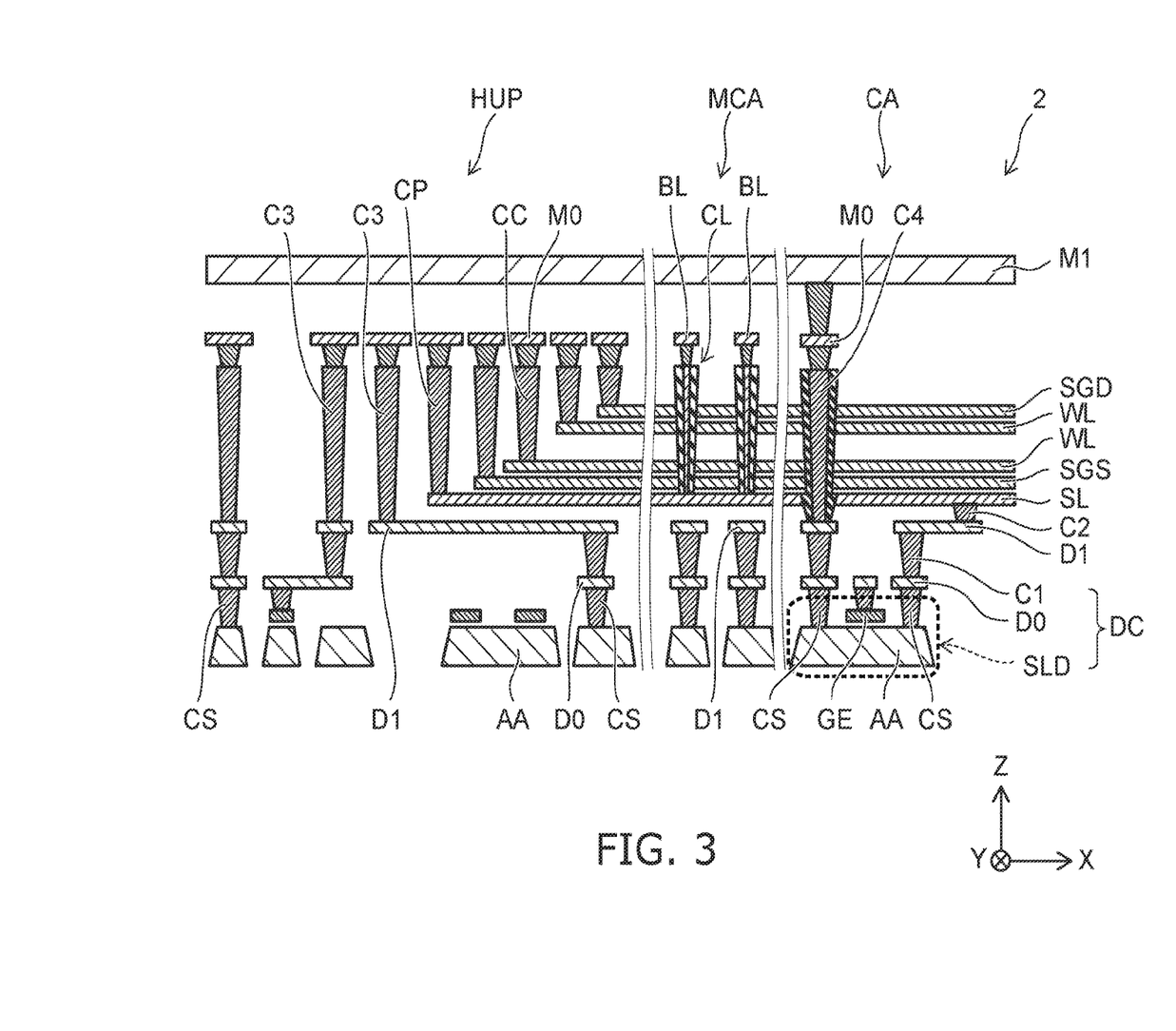
FIG. 3 is a schematic cross-sectional view showing a semiconductor memory device according to a first variation of the embodiment.

FIG. 3 is a schematic cross-sectional view showing a semiconductor memory device 2 according to a first variation of the embodiment. FIG. 3 is a schematic view showing a cross section taken along the A-A line shown in FIG. 1. FIG. 3 is a schematic view showing cross sections of a hook-up area HUP, a memory cell array MCA, and a contact area CA. In the following description, the contact plugs CS, C1, V0 and like, which are electrically connected to the interconnect wires respectively, will be appropriately omitted for convenience. It goes without saying that the interconnect wires are electrically connected via any of the contact plugs.

The semiconductor memory device 2 includes a memory array MCA, a driving circuit DC, and a source line SL arranged therebetween. The source line SL is a plate-shaped conductor extending in the X direction and the Y direction, and includes, for example, a polycrystalline silicon layer or a metal layer, or both.

In the hook-up area HUP, the end portions of the word lines WL, the selection gates SGS and SGD are electrically connected to interconnect wires M0 respectively via contact plugs CC. Further, the end portion of the source line SL is electrically connected to other interconnect wire M0 via a contact plug CP.

In the memory cell array MCA, a plurality of columnar bodies CL are provided, and memory cells are three-dimensionally arranged along each columnar body CL.

In the contact region CA, the transistor SLD is arranged under the source line SL. One of the source and drain regions in the transistor SLD is electrically connected to the source line SL via interconnect wires D0, D1 and the contact plug C2. The other of the source and drain regions in the transistor SLD is electrically connected to an interconnect wire M1 via other interconnect wires D0, D1, a contact plug C4 and an interconnect wire M0.

The contact plug C4 is a conductor such as a metal, and extends in the Z direction through the source line SL, the selection gate SGS, the word lines WL, and the selection gate SGD. Further, the contact plug C4 is electrically insulated from the source line SL, the select gate SGS, the word lines WL and the select gate SGD.

The interconnect wire M1 is, for example, a bias line for supplying the voltage VSS. The transistor SLD controls, for example, the voltage VSS applied to the source line SL when reading out the data stored in the memory cell.

In this manner, the electrical potential of the upper interconnect wire can be applied to the source line SL via the contact plug C4 and the transistor SLD. The uniform potential distribution can be achieved in the source line SL, for example, comparing with the case where the contact plug C4 and the transistor SLD are not disposed, and the voltage VSS is supplied via the contact plug CP, which is electrically connected to the end of the source line SL. Moreover, the circuit configuration may be simplified comparing with the case where multiple potentials, which include the electric potential VSS, are supplied via the contact plug CP.

Figure 4:
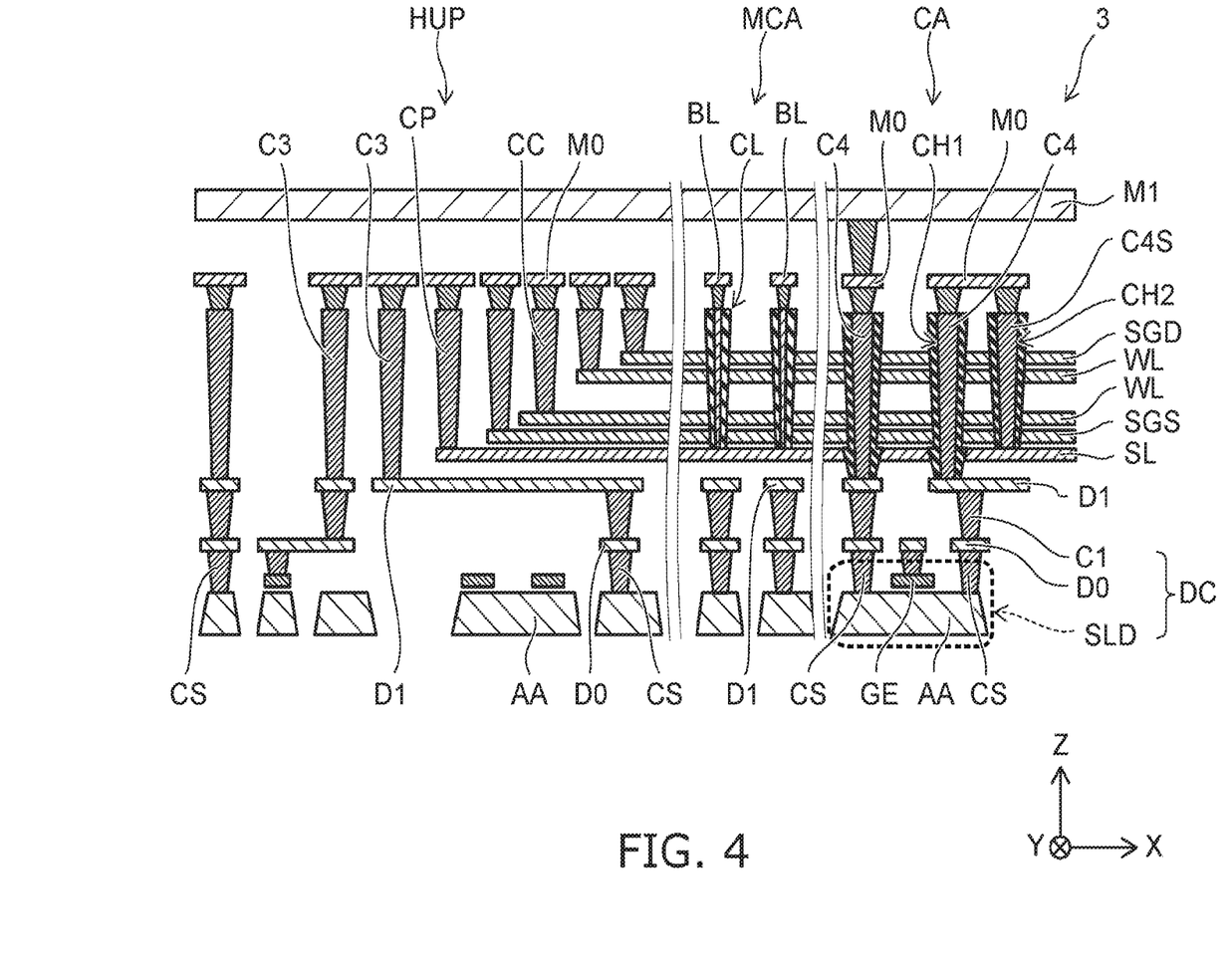
FIG. 4 is a schematic cross-sectional view showing a semiconductor memory device according to a second variation of the embodiment.

FIG. 4 is a schematic cross-sectional view showing a semiconductor memory device 3 according to a second variation of the embodiment. FIG. 4 is a schematic view showing a cross section taken along the A-A line shown in FIG. 1. FIG. 4 is a schematic view showing cross sections of a hook-up area HUP, a memory cell array MCA, and a contact area CA.

The semiconductor memory device 3 includes a source line SL disposed between the memory cell array MCA and a driving circuit DC. The source line SL is a plate-shaped conductor extending in the X direction and the Y direction, and includes, for example, a polycrystalline silicon layer or a metal layer, or both.

In the hook-up area HUP, for example, ends of the word lines WL, the selection gates SGS and SGD are electrically connected to interconnect wires M0 respectively through contact plugs CC. Further, the source line SL is electrically connected to other interconnect wire M0 through a contact plug CP.

In the memory cell array MCA, a plurality of columnar bodies CL are provided, and memory cells are three-dimensionally arranged along each columnar body CL.

In the contact area CA, a transistor SLD is disposed under the source line SL. One of the source drain regions of the transistor SLD is electrically connected to an interconnect wire M1 via an interconnect wire D0, an interconnect wire D1, a contact plug C4 and an interconnect wire M0.

Further, the other of the source/drain regions of the transistor SLD is electrically connected to other interconnect wire M0 via other interconnect wires D0, D1 and contact plug C4. Moreover, the other interconnect wire M0 is electrically connected to the source line SL via a contact plug C4S. That is, in this example, the other of the source/drain regions of the transistor SLD is electrically connected to the source line SL via the other contact plugs C4 and the contact plug C4S.

The other contact plug C4 extends in the Z direction through the source line SL, the selection gate SGS, the word lines WL, and the selection gate SGD. Then, the contact plug C4 is electrically connected to the other interconnect wire D1 at a bottom end thereof. Further, the top end thereof is electrically connected to the other interconnect wire M0 via a contact plug V0.

The contact plug C4S extends in the Z direction through the selection gate SGS, the word lines WL, and the selection gate SGD. Then, the contact plug C4S is electrically connected to the source line SL at a bottom end thereof. Further, a top end thereof is electrically connected to the other interconnect wire M0 via other contact plug V0. The other interconnect wire M0 is electrically connected to the other of the source drain regions of the transistor SLD via the other contact plug C4. In other words, the contact plug C4S shares the other interconnect wire M0 with the other contact plug C4 electrically connected to the transistor SLD.

Also in this example, the source line SL is electrically connected to the interconnect wire M1 via the two contact plugs C4 and C4S and the transistor SLD. Thus, the transistor SLD controls the voltage VSS supplied from the interconnect wire MIL to the source line SL. By disposing at least one such transistor SLD, it is possible to achieve uniform potential distribution in the source line SL when reading data out.

The contact plug C4 is provided in a contact hole CH1, which has a depth from a top surface of the stacked body including the source line SL, the selection gate SGS, the word lines WL, and the selection gate SGD to the interconnect wire D1, for example. On the other hand, the contact plug C4S is provided in a contact hole CH2, which has a depth from the top surface of the stacked body to the source line SL.

For example, when a part through which the contact plug C4 extends is previously provided in the source line SL, the contact holes CH1 and CH2 can be formed at the same time. That is, the contact plugs C4 and C4S can be formed at the same time.

At this time, the interconnect wire D1 and the source line SL act as an etching stopper. Thereby, it is possible to omit, for example, a step of forming the contact plug C2 of the semiconductor memory device 2 shown in FIG. 3, simplifying the manufacturing process, and reducing a cost thereof.

Further, it is preferable that the interconnect wire D1, which is interposed in a path for electrically connecting the transistor SLD and the source line SL, extends to a position under the contact plug C4S. For example, when the contact hole CH2 extends through the source line SL due to variation in the etching process, and is formed so as to extend to the position under the source line SL, the interconnect wire D1 acts as an etching stopper, thereby preventing the contact hole CH 2 from extending therethrough. Although, in this case, the interconnect wire D1 and the source line SL are electrically connected via the contact plug C4S under the selection gate SGS, such a connection provides no influence on the operation of the memory cell array, since both are biased at the same potential.

Figure 5:
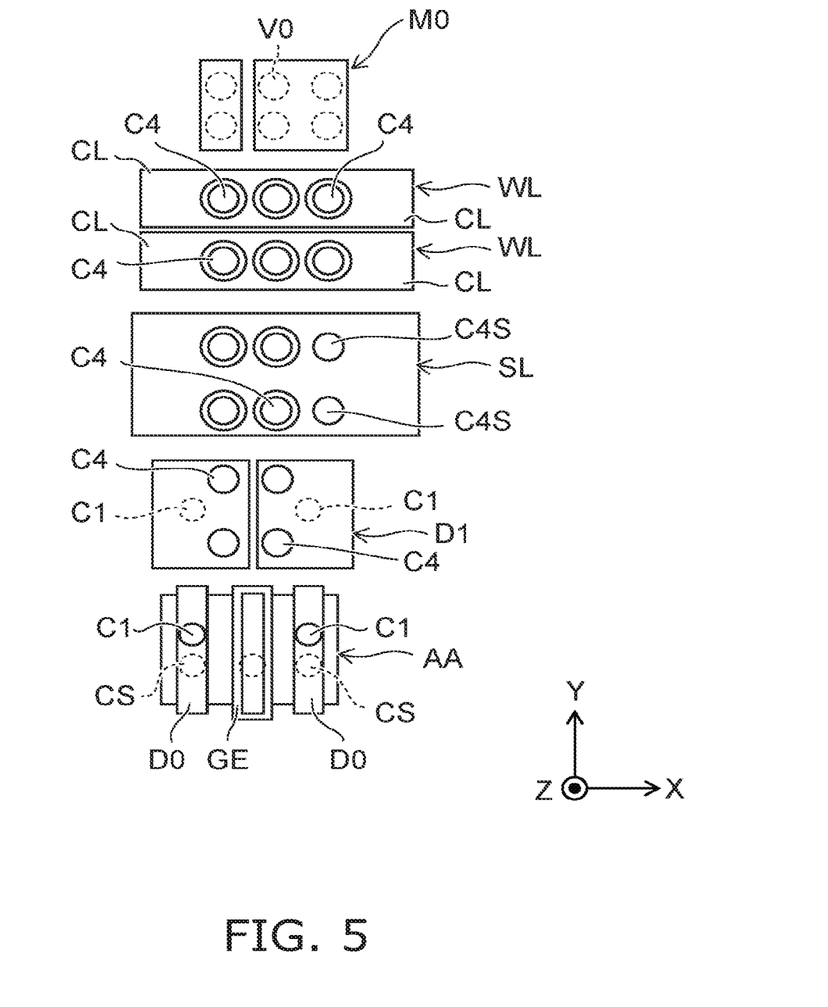
FIG. 5 is a schematic cross-sectional view showing an interconnect architecture between interconnect wires of the semiconductor memory device according to the second variation of the embodiment.

FIG. 5 is a schematic plan view showing an interconnect architecture between interconnect wires in the semiconductor memory device 3. The interconnect wires M0, the word lines WL, the source line SL, the interconnect wires D1 and the interconnect wires D0 are shown from the top to bottom of drawings, and an arrangement of contact plugs is shown, which are provided between the interconnect wires.

As shown in FIG. 5, the interconnect wires M0 are electrically connected to the contact plugs C4 thereunder via the contact plugs V0. The word lines WL extends, for example, in the X direction. The contact plugs C4 extends through the word lines WL.

The source line SL is provided in a plate-shape extending in the X direction and the Y direction. The contact plugs C4 extends downward through the source line SL. The contact plugs C4S of the contact plugs C4 is connected to the source line SL.

The interconnect wires D1 are provided with a planar shape fitted to a circuit pattern in the driving circuit DC. Then, the contact plugs C4 are connected to the interconnect wires D1. On the other hand, the contact plugs C4S are connected to the source line SL and do not reach the level of the interconnect wires D1. Thus, no one of the contact plugs C4S is connected to the interconnect wire D1. Further, the contact plugs C4 and the contact plugs C4S are electrically connected by one of the interconnect wires M0 in the upper stage.

The interconnect wires D1 are electrically connected to the interconnect wires D0 via the contact plugs C1. The interconnect wires D0 extend, for example, in the Y-direction, and are electrically connected to a transistor in the driving circuit DC via the contact plugs CS.

Figure 6A:
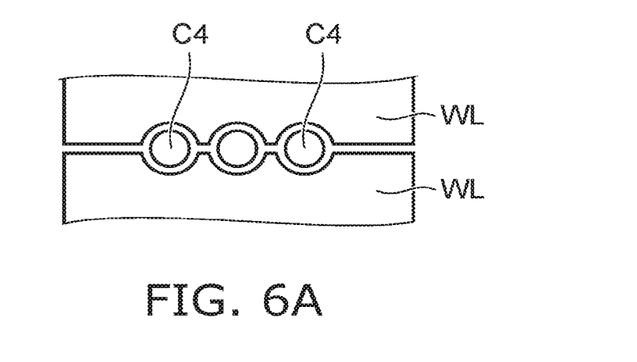
FIGS. 6A to 6C are schematic views showing interconnect wires of the semiconductor memory device according to a variation of the embodiment.
Figure 6B:
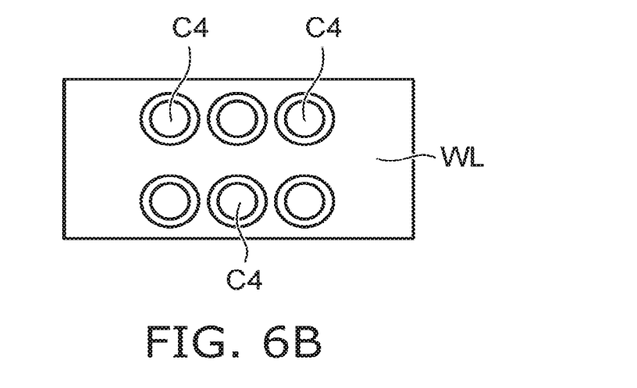
Figure 6C:
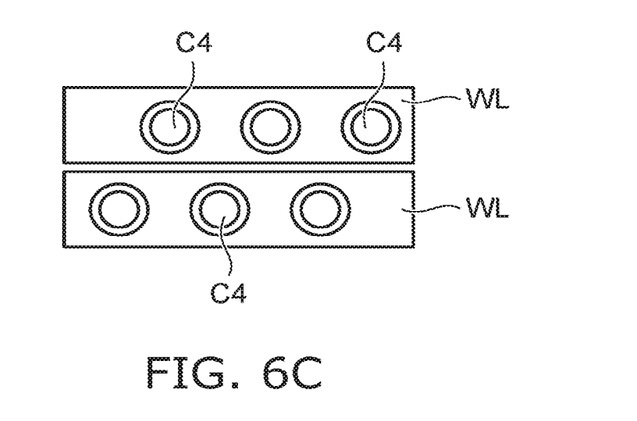

FIGS. 6A to 6C are schematic plan views showing word lines WL according to a variation of the embodiment. As shown in FIG. 6A, the contact plugs C4 may be disposed so as to extend in the—Z direction between two word lines WL adjacent to each other in the Y-direction. In other words, the contact plugs C4 may be disposed so as to extend in the Z-direction through both of the two word lines mutually adjacent in the Y-direction.

As shown in FIG. 6B, the contact plugs C4 arranged in a plurality of lines may be disposed so as to extend through one word line.

Alternately, as shown in FIG. 6C, the contact plugs C4 may be arranged in a so-called staggered arrangement in which an arrangement phase in the extending direction of the word line is shifted between the adjacent word lines WL.

Figure 7:
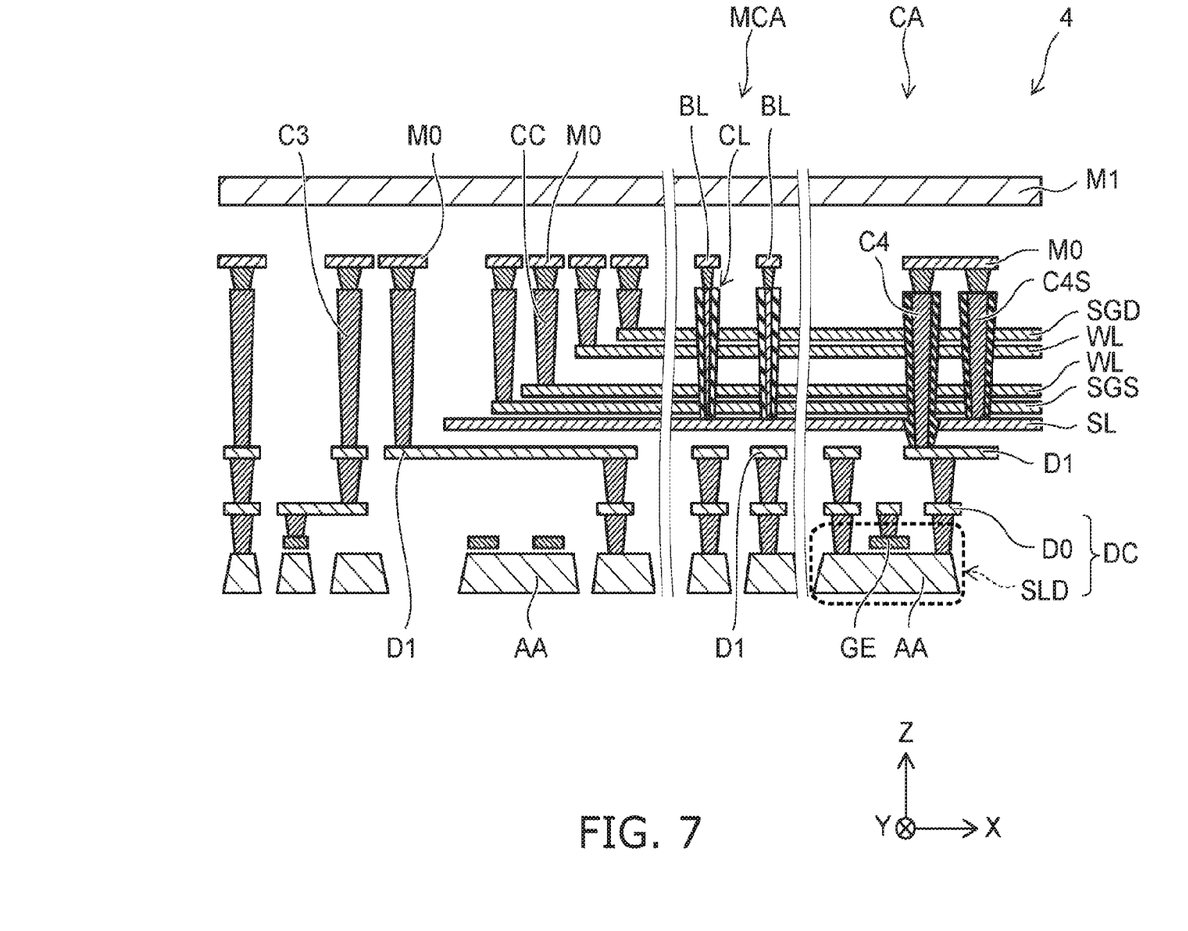
FIG. 7 is a schematic cross-sectional view showing a semiconductor memory device according to a third variation of the embodiment.

FIG. 7 is a schematic cross-sectional view showing a semiconductor memory device 4 according to a third variation of the embodiment. FIG. 7 is a cross-sectional view taken along A-A line in FIG. 1BA.

As shown in FIG. 7A, the semiconductor memory device 4 includes a source line SL disposed between the memory cell array MCA and the driving circuit DC. The source line SL is a plate-shaped conductor extending in the X-direction and the Y-direction. In the contact area CA, the transistor SLD is provided under the source line SL. One of the source/drain regions of the transistor SLD is electrically connected to an interconnect wire M0 via interconnect wires D0, D1 and a contact plug C4.

Further, the interconnect wire M0, which is electrically connected to the transistor SLD, is electrically connected to the source line SL via the contact plug C4S extending in the Z direction through the selection gate SGS, the word lines WL and the selection gate SGD. That is, the transistor SLD, which drives the source line SL, is electrically connected to the source line SL via the two contact plugs C4 and C4S extending through the selection gate SGS, the word lines WL and the selection gate SGD.

Although, in the above embodiment, described are some manners in the semiconductor memory device for electrically connecting the source line SL and the transistor SLD included in the driving circuit DC, wherein the source line SL is provided between the word lines WL and the driving circuit DC, the embodiments is not limited to thereto. For example, the semiconductor memory device shown in FIGS. 2 and 7 may include the contact plug CP in the hook-up area HUP in order to electrically connect the end portion of the source line SL and an interconnect wire M0. Moreover, the arrangement of the contact plugs C4 with respect to the word line WL is not limited to the embodiment, and may be arranged flexibly as shown in FIGS. 6A to 6C.

The driving circuit may have three or more interconnect layers that include D0 and D1. Also three or more interconnect layers, which include M0 and M1, may be provided above the selection gate SGD. Furthermore, the respective selection gates SGD and SGS may include a plurality of electrode layers stacked in the Z direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, the device comprising:
a plurality of word lines stacked in a first direction;
a semiconductor pillar extending through the plurality of word lines in the first direction;
a source line electrically connected to the semiconductor pillar; and
a transistor arranged in the first direction with the plurality of word lines and including a gate electrode, source and drain regions positioned on both sides of the gate electrode respectively,
the source line being positioned between the transistor and the plurality of word lines, and being electrically connected to one of the source and drain regions.

2. The device according to claim 1, further comprising:
a first interconnect wire provided between the transistor and the source line,
the source line being electrically connected to the one of the source and drain regions via the first interconnect wire.

3. The device according to claim 2, further comprising:
a first contact plug electrically connecting the first interconnect wire and the source line.

4. The device according to claim 1, further comprising:
a second contact plug extending in the first direction through the source line and the plurality of word lines, and electrically connected to the other of the source and drain regions; and
a second interconnect wire electrically connected to the second contact plug,
the plurality of word lines being positioned between the second interconnect wire and the source line.

5. The device according to claim 1, further comprising:
a third contact plug electrically connected to an end portion of the source line, and extending in the first direction,
the end portion of the source line is provided in stairs with end portions of the plurality of word lines.

6. The device according to claim 1, further comprising:
a fourth contact plug extending in the first direction through the source line and the plurality of word lines, and electrically connected to the one of the source and drain regions;
a fifth contact plug extending in the first direction through the plurality of word lines, and electrically connected to the source line; and
a third interconnect wire electrically connecting the fourth contact plug and the fifth contact plug,
the plurality of word lines being positioned between the third interconnect wire and the source line.

7. The device according to claim 6, wherein
the fourth contact plug is positioned between the transistor and the third interconnect wire.

8. The device according to claim 6, wherein
the fourth contact plug and the fifth contact plug include metal.

9. The device according to claim 6, further comprising:
a fourth interconnect wire provided between the source line and the transistor, and electrically connected to the one of the source and drain regions and to the fourth contact plug,
the fifth contact plug being positioned between the third interconnect wire and the fourth interconnect wire.

10. The device according to claim 6, further comprising:
a bit line electrically connected to the semiconductor pillar,
the plurality of word lines being positioned between the source line and the bit line, and the third interconnect wire being included in an interconnect layer same as the bit line.

11. The device according to claim 6, further comprising:
a sixth contact plug extending in the first direction through the source line and the plurality of word lines, and electrically connected to the other of the source and drain regions; and
a fifth interconnect wire electrically connected to the sixth contact plug,
the plurality of word lines being positioned between the fifth interconnect wire and the source line.

12. The device according to claim 11, wherein
the fifth interconnect wire supplies a predetermined potential to the source line.

13. The device according to claim 11, further comprising:
a seventh contact plug electrically connected to an end portion of the source line, and extending in the first direction,
the end portion of the source line is provided in stairs with end portions of the plurality of word lines.

14. The device according to claim 1, wherein
the source line is a plate-shaped conductor crossing the first direction.

15. The device according to claim 14, wherein
the source line includes metal or conductive polycrystalline silicon.

16. A semiconductor memory device, the device comprising:
a transistor including a control electrode and first and second semiconductor regions positioned on both sides of the control electrode;
a plurality of electrode layers stacked on the transistor;
an interconnect body provided between the transistor and the plurality of electrode layers;
a semiconductor pillar extending in a stacking direction of the plurality of electrode layers through the plurality of electrode layers, and electrically connected to the interconnect body;
a first conductive body extending in the stacking direction through the plurality of electrode layers and the interconnect body, and electrically connected to one of the first and second semiconductor regions;
a second conductive body extending in the stacking direction through the plurality of electrode layers, and electrically connected to the interconnect body; and
a first interconnect wire electrically connecting the first conductive body and the second conductive body,
the plurality of electrode layers being positioned between the interconnect body and the first interconnect wire.

17. The device according to claim 16, wherein
the first conductive body is positioned between the transistor and the first interconnect wire.

18. The device according to claim 16, further comprising:
a third conductive body extending in the stacking direction through the plurality of electrode layers and the interconnect body, and electrically connected to the other of the first and second semiconductor regions; and
a second interconnect wire electrically connected to the third conductive body,
the plurality of electrode layers being positioned between the interconnect body and the second interconnect wire.

19. The device according to claim 16, further comprising:
a third interconnect wire provided between the interconnect body and the transistor, and electrically connected to the one of the first and second semiconductor regions and to the first conductive body,
the second conductive body being positioned between the first interconnect wire and the third interconnect wire.

20. The device according to claim 18, further comprising:
a fourth conductive body electrically connected to an end portion of the interconnect body, and extending in the stacking direction,
the end portion of the interconnect body being provided in stairs with end portions of the plurality of electrode layers.

* * * * *